United States Patent
Boerstler et al.

(10) Patent No.: US 6,566,921 B1
(45) Date of Patent: May 20, 2003

(54) APPARATUS AND METHOD FOR HIGH RESOLUTION FREQUENCY ADJUSTMENT IN A MULTISTAGE FREQUENCY SYNTHESIZER

(75) Inventors: David William Boerstler, Round Rock, TX (US); Mark Edward Dean, Austin, TX (US); Hung Cai Ngo, Austin, TX (US); Andrew Christian Zimmerman, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/631,718

(22) Filed: Aug. 3, 2000

(51) Int. Cl.[7] .................................................. H03L 7/06
(52) U.S. Cl. ........................................ 327/156; 327/117
(58) Field of Search .................................. 327/147, 156, 327/117, 118, 157, 148; 331/1 A, 17, 25; 375/376

(56) References Cited

U.S. PATENT DOCUMENTS

| | | | | |
|---|---|---|---|---|
| 4,434,696 A | * | 3/1984 | Conviser | 327/115 |
| 4,481,489 A | | 11/1984 | Kurby | 332/19 |
| 5,059,925 A | | 10/1991 | Weisbloom | 331/1 |
| 5,276,408 A | | 1/1994 | Norimatsu | 331/8 |
| 5,349,310 A | | 9/1994 | Rieder et al. | 331/18 |
| 5,353,311 A | * | 10/1994 | Hirata et al. | 375/1 |
| 5,603,099 A | * | 2/1997 | Watanabe | 455/260 |
| 5,694,089 A | | 12/1997 | Adachi et al. | 331/16 |
| 5,710,524 A | * | 1/1998 | Chou et al. | 327/107 |
| 5,751,665 A | | 5/1998 | Tanoi | 368/120 |
| 5,914,592 A | * | 6/1999 | Saito | 324/121 |
| 6,118,316 A | * | 9/2000 | Tamanura et al. | 327/156 |
| 6,188,258 B1 | * | 2/2001 | Nakatani | 327/157 |

FOREIGN PATENT DOCUMENTS

| | | | |
|---|---|---|---|
| EP | 0881775 A | * | 2/1998 |
| JP | 07336217 A | * | 12/1995 |

OTHER PUBLICATIONS

Ishihara (Development of Digitally Controlled Rubidium Atomic Oscillator, Foury–Fourth Annual Symposium On Frequency Control, CH2818–3/90/0000–059 IEEE, pp. 59–65).*

Dynamic Behavior of a Phase–Locked Loop Using D–Type Phase Detector and Nonlinear Voltage–Controlled Oscillator; Boerstler, David W.; Mar. 21, 1981.

* cited by examiner

Primary Examiner—Terry D. Cunningham
Assistant Examiner—Quan Tra
(74) Attorney, Agent, or Firm—Duke W. Yee; Casimer K. Salys; Stephen J. Walder, Jr.

(57) ABSTRACT

An apparatus and a method for making high resolution frequency adjustments in a multistage frequency synthesizer. The initial stage of the frequency synthesizer is a conventional phase lock loop connected to a dynamically variable frequency divider. There are one or more intermediate stages that consist of the forward portion of a phase locked loop with feedback through a fixed frequency divider and connected to a dynamically variable frequency divider. The final stage consists of the forward portion of a phase locked loop with feedback through a fixed frequency divider and connected to another fixed frequency divider. By varying the constant of division in the variable frequency dividers in the circuit, fine frequency adjustments can be made very rapidly. The precision of the adjustments depends on the relative values of the frequency dividers and the number of intermediate stages in the system.

28 Claims, 5 Drawing Sheets

APPARATUS AND METHOD FOR HIGH RESOLUTION FREQUENCY ADJUSTMENT IN A MULTISTAGE FREQUENCY SYNTHESIZER

CROSS-REFERENCE TO RELATED APPLICATIONS

The present invention is related to the following applications entitled "AN APPARATUS AND METHOD FOR DYNAMIC FREQUENCY ADJUSTMENT IN A FREQUENCY SYNTHESIZER", U.S. application Ser. No. 09/631,720, and "AN APPARATUS AND METHOD FOR SYNCHRONIZING NODES IN A HETEROGENEOUS COMPUTER SYSTEM", U.S. application Ser. No. 09/631,712, which are incorporated herein by reference.

BACKGROUND OF THE INVENTION

1. Technical Field

The present invention relates generally to an improved method for frequency generation and in particular to an apparatus and a method for adjusting the generated frequency. Still more particularly, the present invention provides an apparatus and a method for high resolution frequency adjustment using a multistage frequency synthesized.

2. Description of the Related Art

A phase locked loop (PLL) is a very interesting integrated circuit that blends analog and digital techniques. Although the basic design of a PLL has been known for decades, the circuit only became a practical building block in integrated circuit form where the cost has become affordable and the design has become more reliable.

The PLL contains a phase detector, an amplifier, a voltage controlled oscillator (VCO), and a feedback loop that allows the output frequency to be a replication of the input signal with noise removed or a multiple of the frequency of the input signal. PLLs have been used for demodulation of FM signals, for tone decoding, for frequency generation, for generation of "clean" signals, and for pulse synchronization, to name but a few of the applications. Because the output frequency is a multiple of the input frequency, it is difficult to make fine frequency adjustments using such a frequency synthesizer.

A non-uniform memory access (NUMA) computer system is a multiple processor architecture where there is a single memory address space but where memory is separated into "close" banks of memory and "distant" banks of memory. Access is "non-uniform" because the access times for the close banks of memory directly associated with the node that contains the CPU are much faster than the access times for distant memory banks at other nodes in the system. A distinct advantage of a NUMA architecture is that it scales well, in the sense that adding more nodes and processors to the system does not create bottlenecks that degrade performance in the same way as other parallel architectures.

One problem with NUMA architectures is to keep the nodes synchronized. Transactions are often labeled with time stamps that are generated by the time of day at each node in the system. Since these nodes have independent clocks, even though they are initialized at precisely the same time, they will eventually drift apart and require re-synchronization. It is important to have precise time stamps with as little "cycle slippage" as possible between the nodes.

Therefore, it would be advantageous to have a frequency synthesizer that is capable of rapid, high resolution frequency adjustments.

SUMMARY OF THE INVENTION

An apparatus and a method is presented for making high resolution frequency adjustments in a multistage frequency synthesizer. The initial stage of the frequency synthesizer is a conventional phase lock loop connected to a dynamically variable frequency divider.

There are one or more intermediate stages that consist of the forward portion of a phase locked loop with feedback through a fixed frequency divider and connected to a dynamically variable frequency divider. The final stage consists of the forward portion of a phase locked loop with feedback through a fixed frequency divider and connected to another fixed frequency divider.

By varying the constant of division in the variable frequency dividers in the circuit, fine frequency adjustments can be made very rapidly. The precision of the adjustments depends on the relative values of the frequency dividers and the number of intermediate stages in the system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
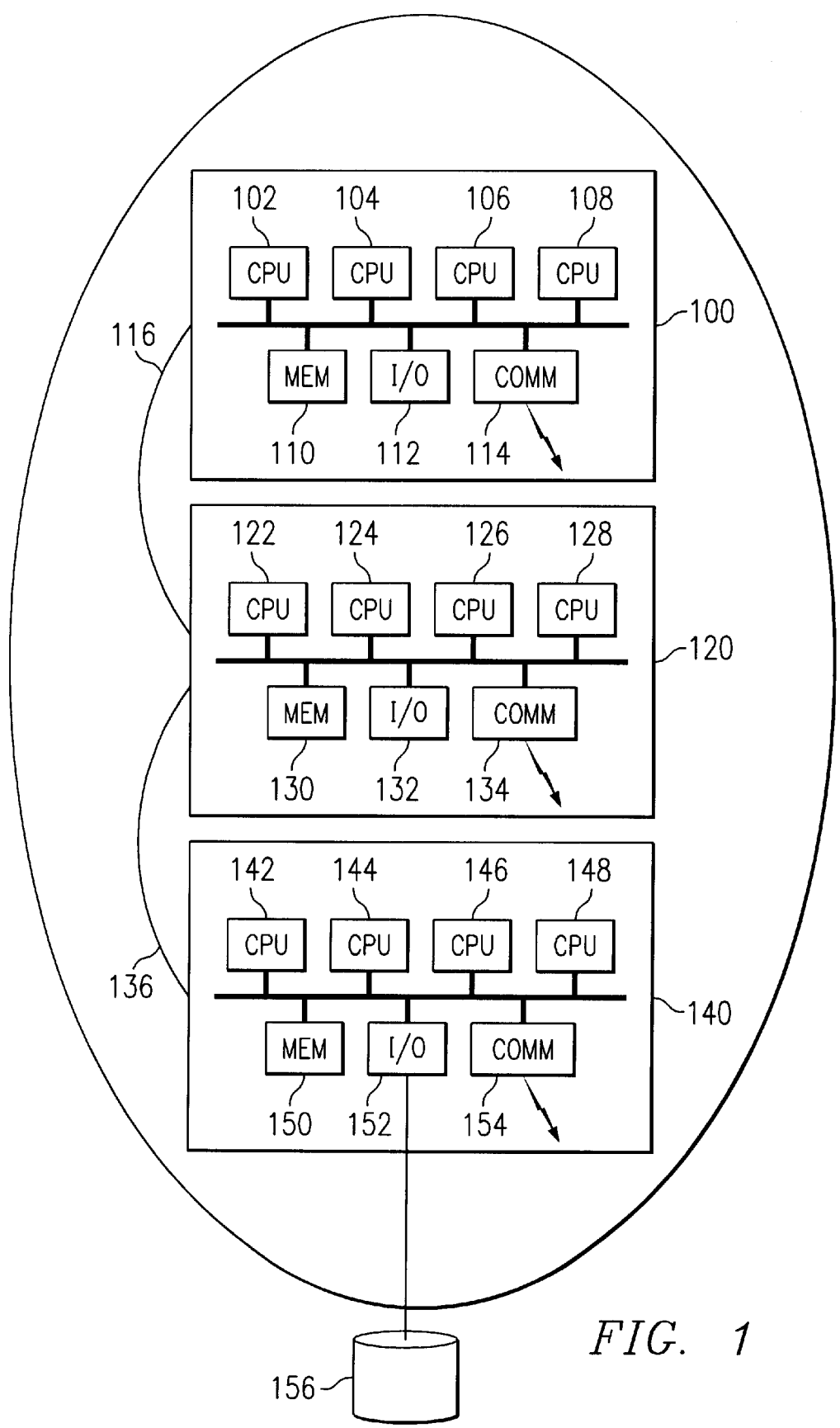
FIG. 1 is a pictorial representation of a multiprocessor system with a non-uniform memory access (NUMA) architecture in which the present invention may be implemented.

With reference now to the figures, and in particular with reference to FIG. 1, a pictorial representation of a multiprocessor system with a non-uniform memory access (NUMA) architecture. This simplified diagram shows a system with three nodes: 100, 120, and 140. Node 100 contains four CPUs, 102, 104, 106, and 108, local memory 110, input/output channels 112, and communications channels, 114. Node 120 contains four CPUs, 122, 124, 126, and 128, local memory 130, input/output channels 132, and communications channels, 134. Node 140 contains four CPUs, 142, 144, 146, and 148, local memory 150, input/output channels 152, and communications channels, 154.

External disk drive 156 is connect to input/output channel 152. The nodes are interconnected using high speed channels 116 and 136. This system contains a single address space composed of memory banks 110, 130, and 150. Access of a CPU to its local memory bank, such as CPU 102 accessing memory 110, will be very fast since it does not need to use the node interconnections 116 or 136. Access by a CPU to a distant memory bank, such as CPU 102 accessing memory 130, will be slower since data must be transferred on communications channel 116.

Those of ordinary skill in the art will appreciate that the hardware depicted in FIG. 1 may vary. For example, the nodes may be arranged in a hypercube network where the number of nodes is a power of two ($2^n$) and each node is connected to exactly n other nodes. For example, each node in a hypercube with 16 nodes would be connected to four other nodes. The depicted example in FIG. 1 is less complex than this and is not meant to imply architectural limitations with respect to the present invention.

FIG. 1 is intended as an example and not as an architectural limitation for the processes of the present invention. The type of processor in a NUMA system may be homogeneous, but the present invention is also applicable to a heterogeneous system where processors or computers of different types are all part of multiprocessor computing environment. It is assumed these separate processors do not share a common clock so there relative frequencies can shift, as illustrated in FIG. 2 given next.

Figure 2:
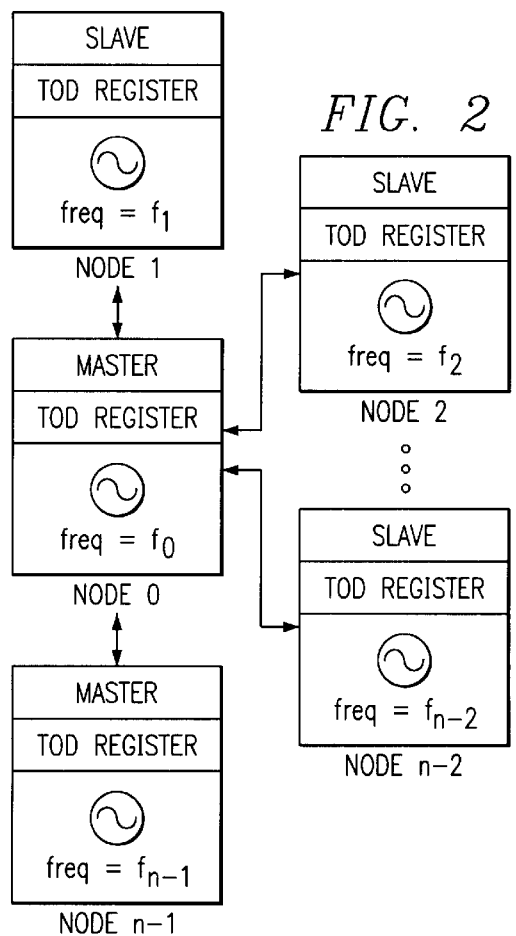
FIG. 2 illustrates multiple nodes in a NUMA architecture in which the present invention may be implemented.

FIG. 2 illustrates multiple nodes in a NUMA architecture, such as the architecture shown in FIG. 1. The n nodes are labeled Node 0, Node 1, Node 2, and so forth through Node n-2, and Node n-1. Each node has an independent frequency source denoted $f_0$ through $f_{n-1}$. These frequency sources are used to generate the timestamp stored in the time of day (TOD) register. Since these nodes have independent clocks, even when the timestamps are initialized at precisely the same time, they will eventually drift apart and require re-synchronization.

Even if the nodes are architecturally similar, one of the nodes needs to be designated the master, in this diagram Node 0, and the other nodes are "slaves", in the sense that their time of day is re-synchronized to the "master" time of day. It is important to have precise frequency generation with as little "cycle slippage" as possible between the nodes. What is required is a frequency generation system with the possibility of making fine adjustments to the system clock frequency on a dynamic basis so that the time of day register value can be changed.

Figure 3:
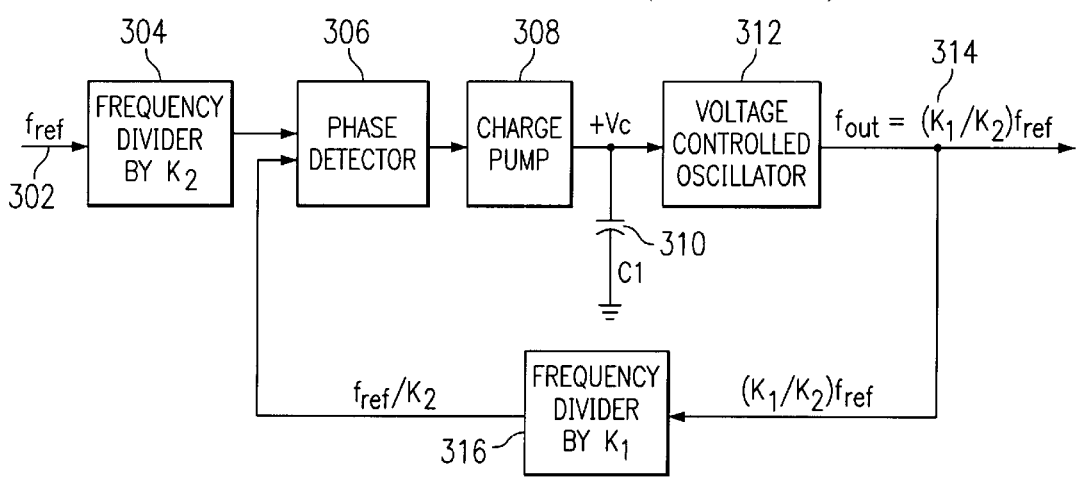
FIG. 3 shows a conventional-frequency synthesizer as it exists in the prior art.

FIG. 3 shows a conventional frequency synthesizer as it exists in the prior art. The input to the phase locked loop is reference frequency 302. Frequency divider 304 divides the reference frequency by $K_2$, which is an integer value in the range of $1, 2, \ldots, N_2$. The output of frequency divider 304 is fed into phase detector 306. The other input to the phase detector will be discussed below. The output of phase detector 306 is fed into charge pump 308. The charge pump creates a current for the period of time during which the phase error exists, which is integrated by capacitor C1 310 to create a voltage Vc which is fed into voltage controlled oscillator (VCO) 312. VCO output is the frequency output from the circuit and equals $(K_1/K_2)$ fret. This signal is fed into frequency divider 316 that divides $f_{out}$ by $K_1$, which is an integer value in the range of $1, 2, \ldots, N_1$. The output of frequency divider 316 equals $f_{ref}/K_2$ at steady-state and this is the second input to phase detector 306. This completes the feedback loop. Since both inputs to phase detector 306 equal $f_{ref}/K_2$, any shift in one of these frequencies will be detected by phase detector 306 and feed through charge pump 308 to voltage controlled oscillator 312. This results in $f_{out}$ being adjusted to bring it back into sync to a value $(K_1/K_2) f_{ref}$.

The values of $K_1$ and $K_2$ must be fixed to avoid cycle-slipping due to PLL pullout frequency. The value of $f_{out}$ is equal to $(K_1/K_2) f_{ref}$. By setting $K_1$ and $K_2$ to different integer values, the output frequency is synthesized based on the input frequency. However, these values cannot be changed dynamically, as explained below.

Figure 4:
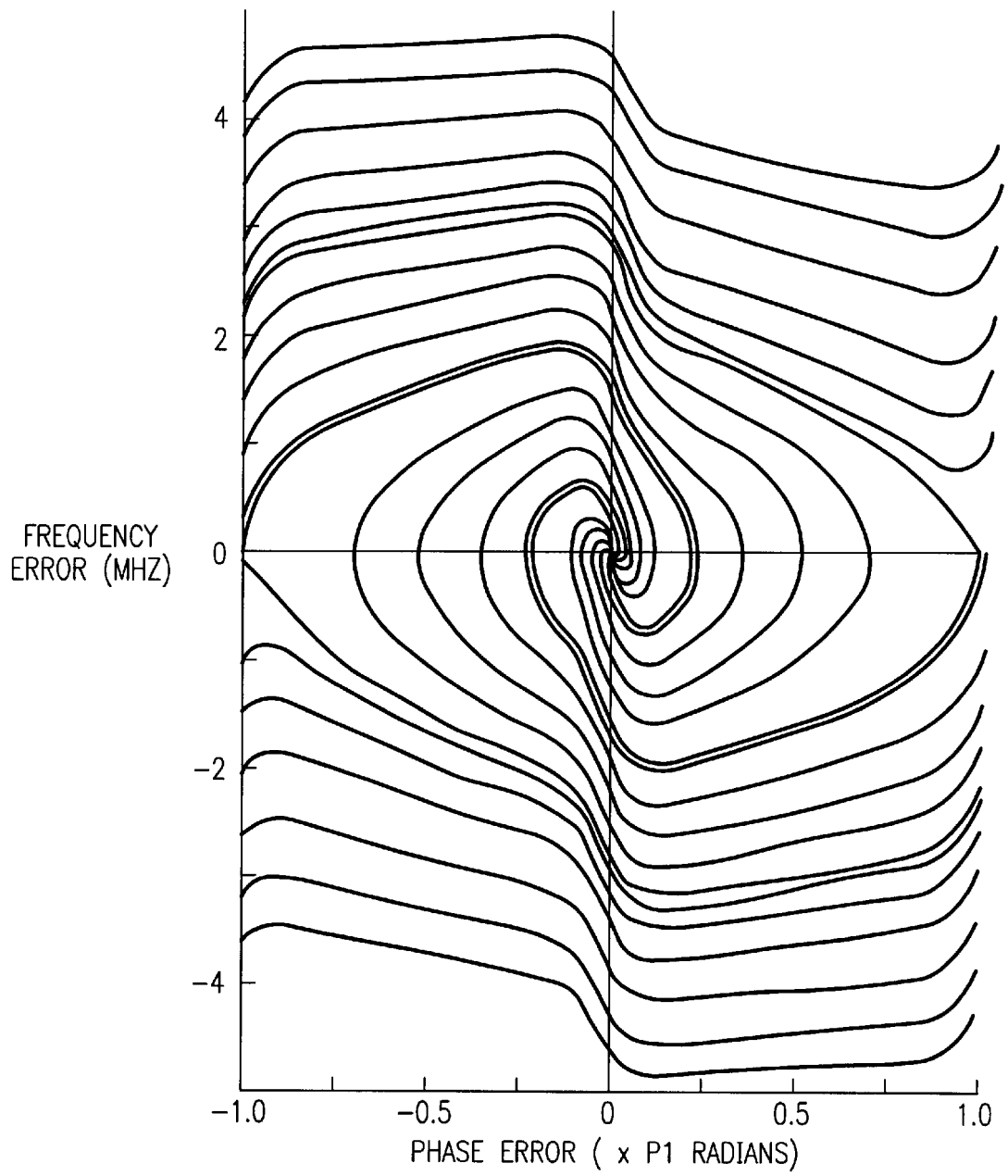
FIG. 4 shows a plot of instantaneous frequency error versus instantaneous phase error for a conventional frequency synthesizer.

FIG. 4 shows a plot of instantaneous frequency error versus instantaneous phase error. A pure frequency error introduced from the steady-state condition at the origin will cause cycle slippage if it exceeds the pullout frequency of approximately 2.5 MHz. In FIG. 4 it can be seen that frequency deviations less than the pullout frequency will naturally go back towards the origin, however, frequency deviations greater than the pullout frequency will result in large instantaneous frequency errors and cycle slipping when the divider settings $K_1$ and/or $K_2$, as shown FIG. 3, are changed. Therefore, when using a conventional phase locked loop, the values of $K_1$ and $K_2$ are fixed which makes fine adjustments of the output frequency impractical.

Figure 5:
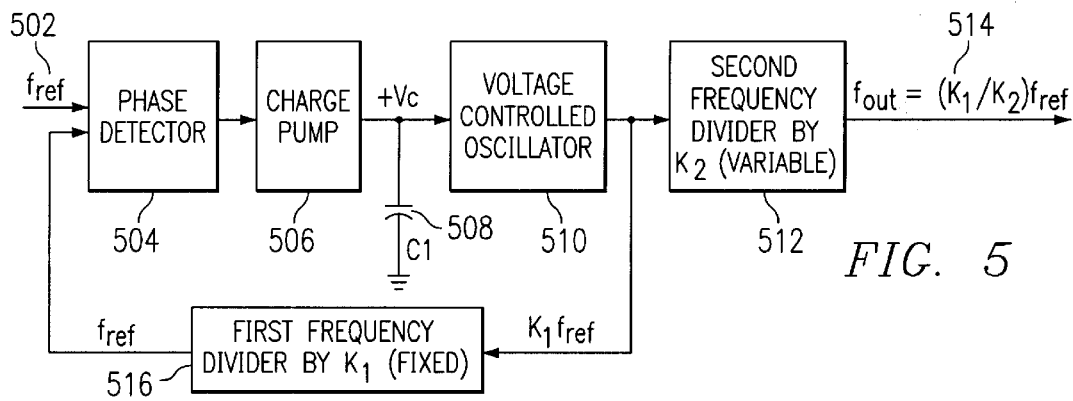
FIG. 5 shows a frequency synthesizer as it exists in a preferred embodiment of this invention.

FIG. 5 shows a frequency synthesizer as it exists in an embodiment of this invention. As in FIG. 3 the input is still $f_{ref}$ and the output is $(K_1/K_2) f_{ref}$. The major difference is that the divide by $K_2$ frequency divider is moved from the input of the circuit to the output of the circuit. As is detailed in the explanation below, this allows the value of $K_2$ to be varied which results in the ability to make fine adjustments to the output frequency. Such adjustments are not possible using the circuit in FIG. 3 due to the problem of cycle slipping.

The input to the phase locked loop is reference frequency 502, which is fed into phase detector 504. The other input to the phase detector will be discussed below. The output of phase detector 504 is fed into charge pump 506. The charge pump creates a current for the period of time during which the phase error exists, which is integrated by capacitor C1 310 to create a voltage Vc which is fed into voltage controlled oscillator (VCO) 512. VCO output equals $K_1, f_{ref}$. This signal is fed into frequency divider 516 that divides it by $K_1$, which is an integer value in the range of $1, 2, \ldots, N_1$. The output of frequency divider 516 equals $f_{ref}$ and this is the second input to phase detector 504. This completes the feedback loop. Since both inputs to phase detector 506 equal $f_{ref}$ any shift in one of these frequencies will be detected by phase detector 504 and fed through charge pump 508 to voltage controlled oscillator 512.

Circuit output $f_{out}$ 514 is generated by feeding the output of VCO 510 into frequency divider 512 which divides its input by $K_2$ to produce the value $(K_1/K_2) f_{ref}$. This is the same output value as the circuit in FIG. 3, but there is one major difference. The value of $K_2$ can be varied without causing cycle slipping.

Of particular interest is the case where $K_1$ is approximately equal to $K_2$ so that the ratio $K_1/K_2$ is equal to 1 plus or minus a small delta factor. Substituting these values in the equation for the output frequency results in $f_{out}=(1\pm D) f_{ref}$. So by varying the value of $K_2$, which can be changed without cycle slipping, the output frequency can be adjusted up or down by small amounts relative to the input frequency.

Figure 6:
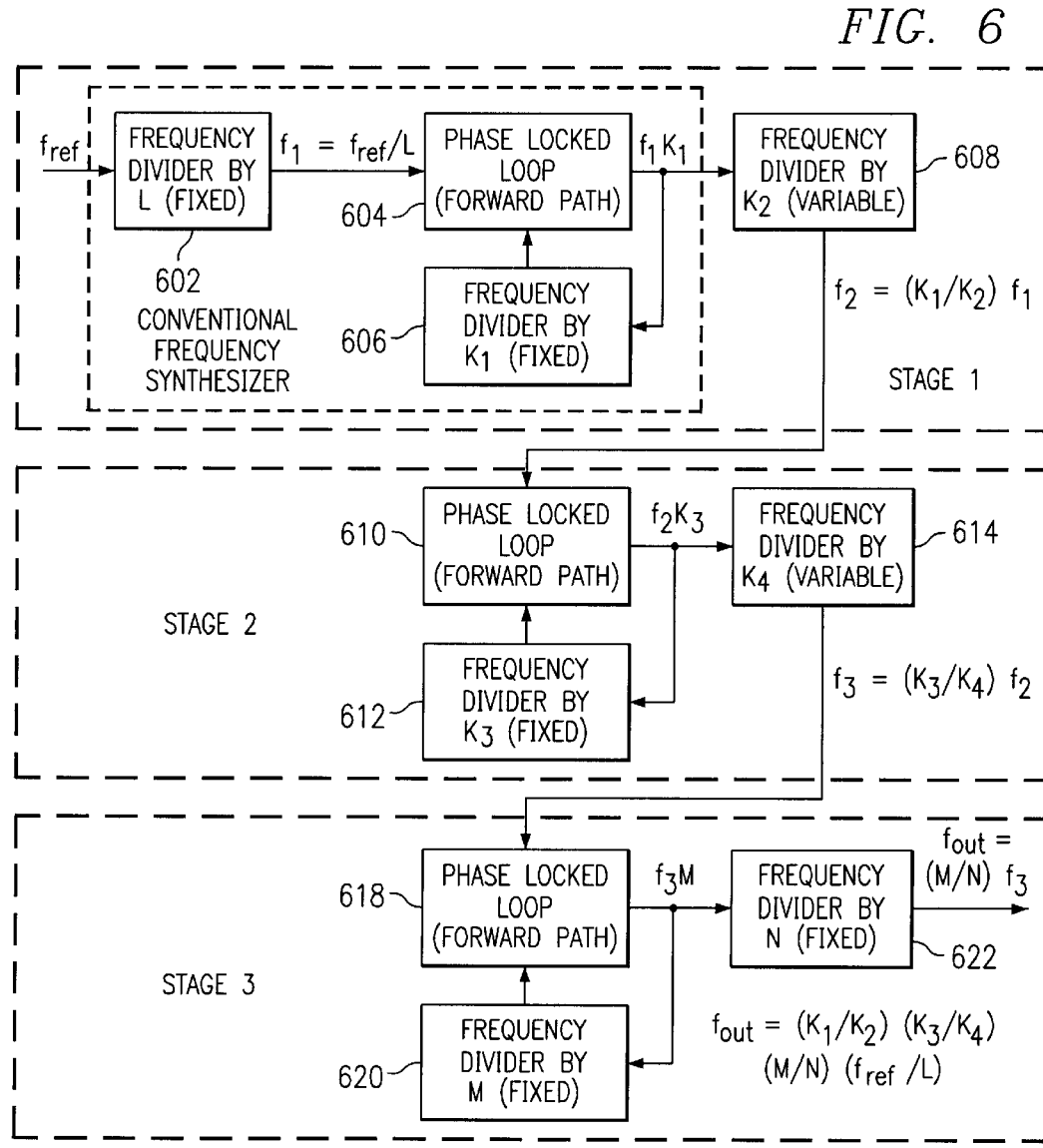
FIG. 6 shows a three stage frequency adjuster in accordance with a preferred embodiment of this invention.

The circuit in FIG. 5 can be cascaded to produce even finer frequency adjustments. A three stage frequency adjuster is shown in FIG. 6. The front end of stage 1 is a conventional frequency synthesizer, similar to that shown in FIG. 3. In particular, frequency divider 602 divides the input frequency, $f_{ref}$, by L. This is fed to the forward path of phase lock loop 604, which contains a phase detector, such as 306, a charge pump, such as 308, a capacitor, such as 310, and a voltage controlled oscillator, such as 312. In FIG. 6 these components are lumped together and referred to as a phase lock loop.

To close the loop, the output of phase lock loop 604 is fed through frequency divider 606 where the division is by $K_1$. This output is fed back as the second input to the phase detector that is part of phase lock loop 604. The frequency output from this conventional frequency synthesizer is $K_1 f_{ref}/L$, where both $K_1$ and L are fixed.

To allow for dynamic frequency adjustment, the output of phase lock loop 604 is the input to frequency divider 608 that divides its input frequency by K2. The value for K2 can be varied dynamically, in a manner similar to the dynamic adjustments to frequency divider 512 in FIG. 5. The detailed circuitry of this dynamic frequency divider are disclosed in FIG. 7. The output from stage 1 of the three stage frequency adjuster is $(K_1 f_{ref})/(K_2 L)$ where $K_1$, and L are fixed and $K_2$ is variable. We label this output as $f_2$.

Stage 2 of the three stage frequency adjuster contains the forward path of phase locked loop 610, the feedback circuit with frequency divider 612 that divides by $K_3$, and the frequency divider 614 at the output that divides by $K_4$. The frequency output of stage 2 equals $(K_3/K_4) f_2$; this frequency is referred to as $f_3$. The value of $K_3$ is fixed but the value of $K_4$ is variable.

Stage 3 of the three stage frequency adjuster has the same structure as stage 2. It contains the forward path of phase locked loop 618, feedback loop with frequency divider 620 that divides by M, and frequency divider 622 on the output that divides by N. The frequency output, $f_{out}$, of this final stage equals $(M/N) f_3$. The values of M and N are both fixed.

Substituting the various formulas for each stage of the circuit, it can be seen that $f_{out} = (K_1/K_2)(K_3/K_4)(M/N)(f_{ref}/L)$ where $K_2$ and $K_4$ are variable. It is instructive to substitute typical frequency values to see how the output frequency can be tuned with high refinement. Let $f_{ref}$ be 150 MHz. The values of the various dividers will be chosen so that the output frequency will also be 150 MHz, but by varying the values of $K_2$ and $K_4$, fine adjustments can be obtained. L, $K_1$, and $K_3$ are set to 100. M and N are set to 200 and 2, respectively. In case 1, $K_2$ is set to 119 and $K_4$ is set to 84. The resultant output frequency is 150.06 MHz; this is a change of +60,000 Hz for 150 MHz or +400 parts per million (PPM). In case 2, $K_2$ is set to 122 and $K_4$ is set to 82. The resultant output frequency is 149.94 MHz; this is a change of −60,000 Hz for 150 MHz or −400 PPM.

By carrying through the calculations stage-by-stage, it is found the frequency shifts at stage 2 are less than 2.5% and at stage 3 are less than 0.08%. As one of ordinary skill in the art will appreciate, greater refinement of frequency adjustment can be obtained when more stages are cascaded. The frequency divider at the output of each stage, except for the last stage, can be made variable.

Frequency dividers in the prior art are hardwired to a particular divisor value. Therefore, a new circuit had to be devised that could divide by any integer value and that could change the divisor value very quickly.

Figure 7:
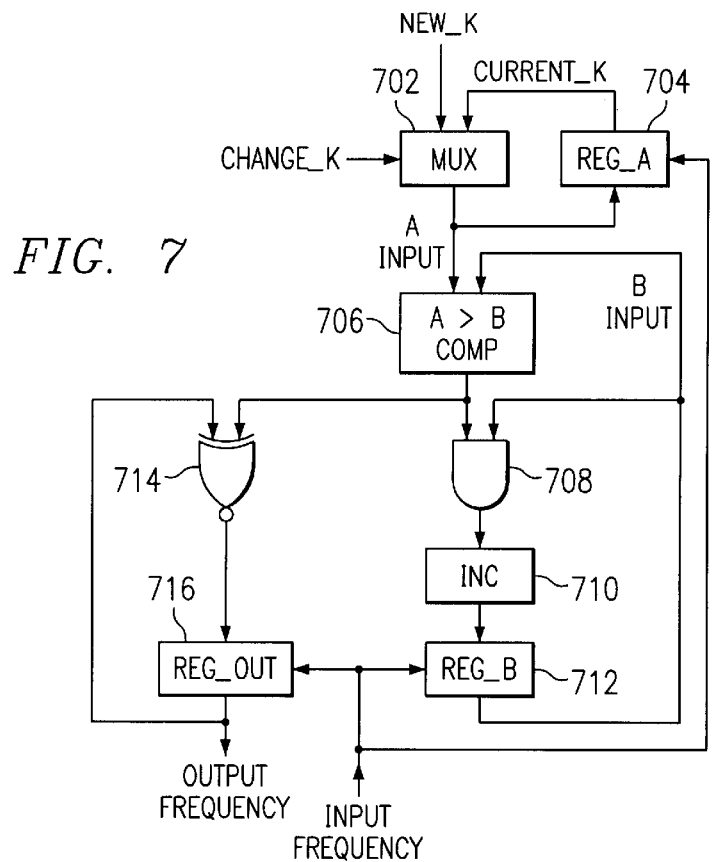
FIG. 7 shows the detailed circuitry of a dynamic frequency divider as it exists in a preferred embodiment of this invention.

With reference now to FIG. 7, a circuit diagram is given for a dynamic frequency divider. REG_A 704 holds the divisor, call it K. REG_B 712 holds the current counter value. REG_OUT 716 is a one-bit register that holds the output state. All three registers are clocked synchronously by the input frequency. MUX (multiplexer) 702 has two inputs, NEW_K and CURRENT_K, and one of these is selected based on the value of CHANGE_K. When CHANGE_K is activated, the output of the MUX is the input NEW_K. If CHANGE_K is not activated, then the output of the MUX is input CURRENT_K.

Comparator A>B COMP 706 is on whenever the current counter value is less than the current divisor value. Whenever the comparator 706 is on, the incrementer INC 710 increases the counter value by 1 and saves the new value in REG_B 712. The output state based on the setting of REG_OUT 716 remains the same. When the counter value exceeds the divisor value, then the output of comparator 706 is off, which causes the incrementer to be set back to 1 and the value of REG_OUT 716 to be toggled resulting in the output frequency changing state.

Examination of particular frequency values helps understand operation of this circuit. Suppose the output of the multiplexer is a divisor value of 120 and the value in REG_B 712 has just been reset, so REG_B 712 counts from the value 1 up to the divisor value. When this counter equals the divisor value, it triggers the output of A>B COMP 706 to change state. This has two effects: it resets the value in REG_B to 1 and it toggles the output frequency from REG_OUT 716. For every 120 pulses on the input, there is one pulse on the output. So the circuit functions like a "divide by 120" circuit.

Suppose that the value of NEW_K is 110 and the CHANGE_K command is received; this transfers the value of 110 to the "A INPUT" of the multiplexer. There are two possible cases: the counter value in REG_B is less than 110 or the counter value is between 110 and 120. If the case the counter is less than 110, REG_B 712 continues to count but now will be reset when 110 is reached. If the value in REG_B is already greater than 110, then the output of comparator A>B COMP is switched which results in toggle of the output frequency and a reset of the counter.

As one of ordinary skill in the art will appreciate, the case where NEW_K is larger than CURRENT_K is even easier. The current counter value is less than NEW_K, so once the multiplexer switches the input to the comparator, the counter will continue to count up until the new divisor value is reached.

Figure 8:
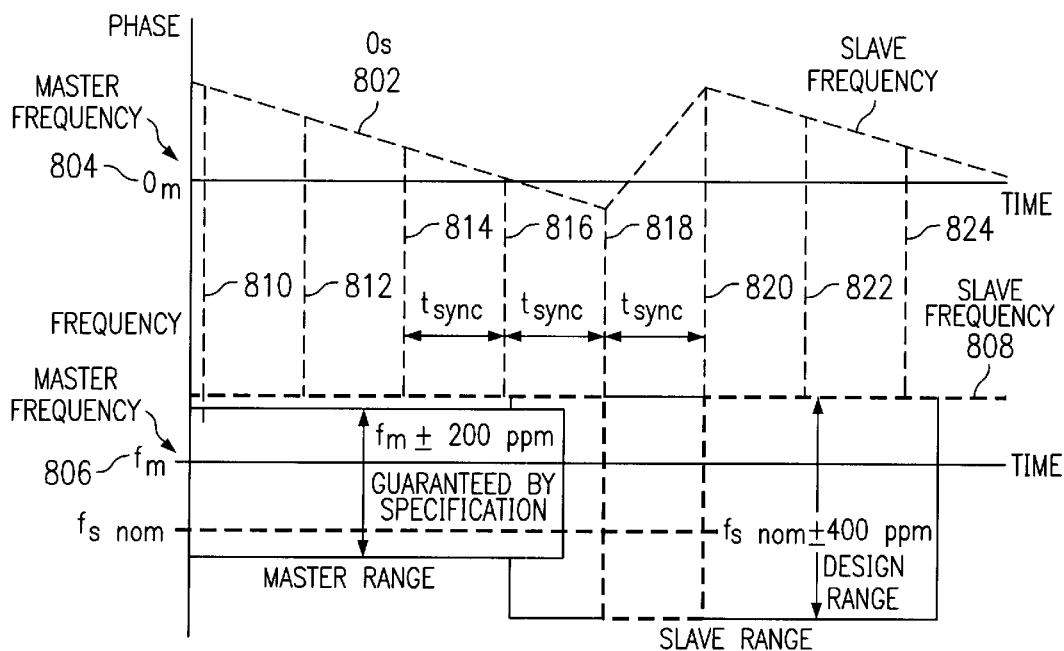
FIG. 8 is a plot for phase and frequency adjustments as a function of time in accordance with a preferred embodiment of this invention.

With reference now to FIG. 8, a plot is given for phase and frequency adjustments as a function of time. The phase of the slave frequency $f_s$, appears as sawtooth 802 at the top of the figure while the phase of the master frequency $f_m$ appears as horizontal line 804. The term "phase" here is not to be interpreted in an analog sense, rather it is applied to the digital contents of the two time of day registers. There registers are incremented by their respective system clocks, so as these clock frequencies slowly drift apart, the register values represent the accumulation of the phase slippage between the two clocks. The phase of the slave frequency is initially declining and will eventually cross the phase of the master frequency. Once this crossing is detected, the clock frequency of the slave will be adjusted.

The master frequency $f_m$ appears as horizontal line 806 at the bottom of the figure. Slave frequency 808 is shown as a dashed line at the bottom of the figure; it is shown initially 200 PPM greater than the master frequency 806. Vertical dashed lines 810, 812, 814, 816, 818, 820, 822, and 824 indicate the times that the phases of the master and slave signals are compared and, when required, corrections are applied.

At times 810, 812, 814, and 816 the phase of the slave 802 is greater than the phase of the master 804. During these same intervals, the frequency of the slave 808 is 200 PPM greater than the frequency of the master 806. At synchronization time 818, the phase of the slave 802 is less than the phase of the master 804. When this is detected, the variable dividers in the multistage frequency synthesizer associated with the slave are adjusted to produce a frequency of the slave 808 200 PPM less than the frequency of the master 806. This causes the phase of the slave 802 to rise quickly until at time 820 it is again greater than the master. This causes the frequency of the slave 808 to switch between being 200 PPM less than the master 806 to being 200 PPM greater than the master. During time intervals 822 and 824 the phase of the slave 802 is still greater than the phase of the master 804, so the frequency of the slave 808 remains at 200 PPM greater than the frequency of the master 806.

As one of ordinary skill in the art will appreciate, once the phase of the slave 802 becomes less than the phase of the master 804, the frequency of the slave 808 will drop to 200 PPM less than the frequency of the master 806 to bring the system back into balance. This continual detection of phase differences and resulting frequency adjustments will keep the time of day registers synchronized during the operation of the computer system. If these adjustments were not made, over a longer period of time the register discrepancies would become so large as to cause system malfunctions as a result of timestamp problems. However, since these synchronization times occur every thousand clock cycles or so in a typical embodiment, the time of day values never shift enough to cause any serious problems. Solutions to this problem in the prior art involved expensive hardware, such as using an external atomic clock, to provide synchronization. Using this invention, two or more time of day registers at different nodes in a multiple processor system can be synchronized with a minimum of additional hardware.

The description of the present invention has been presented for purposes of illustration and description but is not intended to be exhaustive or limited to the invention in the form disclosed. Many modifications and variations will be apparent to those of ordinary skill in the art. The embodiment was chosen and described in order to best explain the principles of the invention and the practical application, and to enable others of ordinary skill in the art to understand the invention for various embodiments with various modifications as are suited to the particular use contemplated.

What is claimed:

1. An apparatus for dynamically making fine adjustments to a frequency output of a multistage frequency synthesizer, the apparatus comprising:

a first stage of the multistage frequency synthesizer with an input and an output;

one or more intermediate stages, wherein each intermediate stage receives an input from a previous stage and includes a variable frequency divider that generates an output to a next stage; and a final stage with an input from a last intermediate stage and generating the frequency output of the multistage frequency synthesizer, wherein the first stage comprises a first frequency synthesizer, wherein a reference frequency is received at an input to the first frequency synthesizer, and further comprising a first variable frequency divider, wherein the first variable frequency divider receives a signal from the first frequency synthesizer and the output of the first stage is the output of the first variable frequency divider, and wherein the first frequency synthesizer in the first stage of the multistage frequency synthesizer further comprises:

a first fixed frequency divider with an input and an output, wherein the input of the first fixed frequency divider is a reference frequency, $f_{ref}$, where the reference frequency is the input to the multistage frequency synthesizer;

a forward path in a phase locked loop with a first input, a second input, and an output, wherein the first input of the forward path in a phase locked loop is the output of the first fixed frequency divider; and a second fixed frequency divider with an input and an output, wherein the input of the second fixed frequency divider is connected to the output of the forward path in a phased lock loop and the output of the second fixed frequency divider is connected to the second input of the forward path of a phase lock loop; and the output of the forward path in the phase lock loop is the output of the first frequency synthesizer.

2. The apparatus of claim 1, wherein an intermediate stage from the set of intermediate stages comprises:

a forward path of a phase lock loop with a first input, a second input, and an output, wherein the first input of the forward path of a phase lock loop is connected to an output from a previous stage; and a fixed frequency divider with an input and an output, wherein the input of the fixed frequency divider is connected to the output of the forward path of the phase lock loop and the output of the fixed frequency divider is connected to the second input of the forward path of a phase lock loop, wherein the input of the variable frequency divider of the intermediate stage is connected to the output of the forward path of a phase lock loop.

3. The apparatus of claim 2, wherein the final stage further comprises:

a forward path of a phase lock loop in the final stage with a first input, a second input, and an output, wherein the first input of the forward path of a phase lock loop in the final stage is connected to the output of a last intermediate stage of the one or more intermediate stages;

a first fixed frequency divider with an input and an output, wherein the input of the first fixed frequency divider is connected to the output of the forward path of a phase lock loop and the output of the first fixed frequency divider is connected to the second input of the forward path of a phase lock loop; and a second fixed frequency divider with an input and an output, wherein the input of the second fixed frequency divider is connected to the output of the forward path of a phase lock loop and the output of the second fixed frequency divider is the output of the final stage and the output of the multistage frequency synthesizer.

4. The apparatus of claim 3, wherein the forward path in a phase lock loop further comprises:

a phase detector with a first input, a second input, and an output, wherein the first input receives an input frequency for the forward path in a phase lock loop; and a variable frequency oscillator with an input and an output, wherein the variable frequency oscillator is responsive to the output of the phase detector and the output of the variable frequency oscillator is the output of the forward path in the phase lock loop.

5. The apparatus of claim 4, wherein the variable frequency divider further comprises:

a multiplexer that selects one of a current divisor value and a new divisor value based on a selector signal;

a counter that counts up to the selected divisor value, wherein once the divisor value is equaled, the counter is reset and toggles an output register to generate an output frequency.

6. The apparatus of claim 5, wherein the counter is clocked by an input frequency, $f_{in}$.

7. The apparatus of claim 6, wherein if the selected divisor value is K then the output frequency of the output register is $f_{in}/K$.

8. The apparatus of claim 4, wherein if an input to the first frequency synthesizer in the first stage of the multistage frequency synthesize is the reference frequency, $f_{ref}$, and if a constant of division for the first fixed divider in the first frequency synthesizer is L, and if a constant of division for the second fixed divider in the first frequency synthesizer is $K_1$, then the output of the first frequency synthesizer in the first stage of the multistage frequency synthesize is generated as: $(f_{ref}/L)*K_1$.

9. The apparatus of claim 8, wherein if a constant of division for the variable frequency divider in the first stage of the multistage frequency synthesizer is $K_2$, then the output of the first stage is generated as: $(f_{ref}/L)*(K_1/K_2)$.

10. The apparatus of claim 9, wherein the one or more intermediate stages consists of a single intermediate stage.

11. The apparatus of claim 10, wherein if an input to the single intermediate stage is the output of the first stage in the multistage frequency synthesizer, and if a constant of division for the fixed frequency divider in the single intermediate stage is $K_3$, and if a constant of division for the variable frequency divider in the single intermediate stage is $K_{41}$, then the output of the single intermediate stage is generated as:

$$(f_{ref}/L)*(K_1/K_2)*(K_3/K_4).$$

12. The apparatus of claim 11, wherein if an input to the final stage is the output of the single intermediate stage, and if a constant of division for the first fixed frequency divider in the final stage is M, and if a constant of division for the second fixed frequency divider in the final stage is N, then the output of the final stage and the output of the multistage frequency synthesizer is generated as:

$$(f_{ref}/L)*(K_1/K_2)*(K_3/K_4)*(M/N).$$

13. The apparatus of claim 12, wherein the output of the multistage frequency synthesizer is varied dynamically by adjusting the constant of division, $K_2$, and the constant of division, $K_4$.

14. A method for dynamically making fine adjustments to a frequency output of a multistage frequency synthesizer, the method comprising the steps of:
receiving a first input at a first stage of the multistage frequency synthesizer and generating a first output;
generating an output from one or more intermediate stages, wherein each intermediate stage receives an input from a previous stage and includes a variable frequency divider that generates an output to a next stage; and
receiving an input from a last intermediate stage at a final stage and generating the frequency output of the multistage frequency synthesizer,
wherein the first stage comprises a first frequency synthesizer, wherein a reference frequency is received at an input to the first frequency synthesizer, and further comprising a first variable frequency divider, wherein the first variable frequency divider receives a signal from the first frequency synthesizer and generates the output of the first stage as an output of the first variable frequency divider, and
wherein generating the first output at the first frequency synthesizer in the first stage of the multistage frequency synthesizer further comprises the steps of:
receiving an input at a first fixed frequency divider and generating an output, wherein the input received at the first fixed frequency divider is a reference frequency, $f_{ref}$, where the reference frequency is the input to the multistage frequency synthesizer;
generating an output from a forward path in a phase locked loop, wherein the forward path in a phase locked loop receives a first input from the output of the first fixed frequency divider; and
receiving an input at a second fixed frequency divider and generating an output, wherein the input of the second fixed frequency divider is received from the output of the forward path in a phased lock loop and the output of the second fixed frequency divider is sent to the second input of the forward path of a phase lock loop; and
the output generated by the forward path in the phase lock loop is the output of the first frequency synthesizer.

15. The method of claim 14, wherein generating an output from an intermediate stage from the one or more intermediate stages comprises the steps of:
receiving a first input from an output of a previous stage at a forward path of a phase lock loop, wherein the forward path of the phase lock loop has a first input, a second input, and an output; and
receiving the output of the forward path of the phase lock loop at an input of a fixed frequency divider, wherein an output of the fixed frequency divider is sent to the second input of the forward path of a phase lock loop, wherein the input of the variable frequency divider of the intermediate stage is received from the output of the forward path of a phase lock loop.

16. The method of claim 15, wherein generating the frequency output of the multistage frequency synthesizer from the final stage further comprises the steps of:
receiving a first input and a second input at a forward path of a phase lock loop in the final stage and generating an output, wherein the first input of the forward path of a phase lock loop in the final stage is received from the output of a last intermediate stage in the set of intermediate stages;
receiving an input at a first fixed frequency divider and generating an output, wherein the input of the first fixed frequency divider is received from the output of the forward path of a phase lock loop and the output of the first fixed frequency divider is sent to the second input of the forward path of a phase lock loop; and
receiving an input at a second fixed frequency divider and generating an output, wherein the input of the second fixed frequency divider is received from the output of the forward path of a phase lock loop and the output of the second fixed frequency divider is the output of the final stage and the output of the multistage frequency synthesizer.

17. The method of claim 16, wherein generating the output of the forward path in a phase lock loop further comprises the steps of:
receiving at a phase detector a first input and a second input, and generating an output, wherein the first input receives an input frequency for the forward path in a phase lock loop; and
receiving an input at a variable frequency oscillator and generating an output, wherein the variable frequency oscillator is responsive to the output of the phase detector and the output of the variable frequency oscillator is the output of the forward path in the phase lock loop.

18. The method of claim 17, wherein varying the final output frequency of the second frequency divider further comprises the steps of:

selecting one of a current divisor value and a new divisor value based on a selector signal received at a multiplexer;

counting up to the selected divisor value in a counter, wherein once the divisor value is equaled, an output register is toggled to generate the final output frequency.

19. The method of claim 18, wherein the counter is clocked by an input frequency, $f_{in}$.

20. The method of claim 18, wherein if the selected divisor value is K then the final output frequency of the output register is $f_{in}/K$.

21. The method of claim 17, wherein if an input to the first frequency synthesizer in the first stage of the multistage frequency synthesize is the reference frequency, $f_{ref}$, and if a constant of division for the first fixed divider in the first frequency synthesizer is L, and if a constant of division for the second fixed divider in the first frequency synthesizer is $K_1$, then the output of the first frequency synthesizer in the first stage of the multistage frequency synthesize is generated as: $(f_{ref}/L)*K_1$.

22. The method of claim 21, wherein if a constant of division for the variable frequency divider in the first stage of the multistage frequency synthesizer is $K_2$, then the output of the first stage is generated as: $(f_{ref}/L)*(K_1/K_2)$.

23. The method of claim 22, wherein the one or more intermediate stages consists of a single intermediate stage.

24. The method of claim 23, wherein if an input to the single intermediate stage is the output of the first stage in the multistage frequency synthesizer, and if a constant of division for the fixed frequency divider in the single intermediate stage is $K_3$, and if a constant of division for the variable frequency divider in the single intermediate stage is $K_4$, then the output of the single intermediate stage is generated as:

$$(f_{ref}/L)*(K_1/K_2)*(K_3/K_4).$$

25. The method of claim 24, wherein if an input to the final stage is the output of the single intermediate stage, and if a constant of division for the first fixed frequency divider in the final stage is M, and if a constant of division for the second fixed frequency divider in the final stage is N, then the output of the final stage and the output of the multistage frequency synthesizer is generated as:

$$(f_{ref}/L)*(K_1/K_2)*(K_3/K_4)*(M/N).$$

26. The method of claim 25, wherein the output of the multistage frequency synthesizer is varied dynamically by adjusting the constant of division, $K_2$, and the constant of division, $K_4$.

27. A frequency synthesizer, comprising:

a first stage with an input and an output;

an intermediate stage having a voltage controlled oscillator; and a variable frequency divider that receives an input from the first stage and generates an output to the intermediate stage, wherein the variable frequency divider further comprises:

a multiplexer that selects one of a current divisor value and a new divisor value based on a selector signal; and a counter that counts up to the selected divisor value, wherein once the divisor value is equaled, the counter is reset and toggles an output register to generate an output frequency.

28. A frequency synthesizer, comprising:

a first stage; and a second stage coupled to the first stage, wherein the first stage includes a first variable frequency divider that generates a frequency output to the second stage, and wherein the second stage includes a second variable frequency divider that generates a frequency output of the second stage, wherein each of the first variable frequency divider and the second variable frequency divider include:

a multiplexer that selects one of a current divisor value and a new divisor value based on a selector signal; and a counter that counts up to the selected divisor value, wherein once the divisor value is equaled, the counter is reset and toggles an output register to generate an output frequency.

* * * * *

UNITED STATES PATENT AND TRADEMARK OFFICE
CERTIFICATE OF CORRECTION

PATENT NO.    : 6,566,921 B1
DATED         : May 20, 2003
INVENTOR(S)   : Boerstler et al.

It is certified that error appears in the above-identified patent and that said Letters Patent is hereby corrected as shown below:

Column 2,
Line 35, after "shows a", delete "conventional-frequency" and insert -- conventional frequency --.

Column 9,
Line 28, after "stage is", delete "K41" and insert -- K4 --.

Signed and Sealed this

Second Day of December, 2003

JAMES E. ROGAN
*Director of the United States Patent and Trademark Office*